United States Patent [19]

Katohno et al.

[11] Patent Number: 4,673,808
[45] Date of Patent: Jun. 16, 1987

[54] DISC FOR ROTARY ENCODER AND METHOD FOR PRODUCING SAME

[75] Inventors: Takashi Katohno; Ryouhei Koyama, both of Hyuga, Japan

[73] Assignee: Asahi Kasei Kogyo Kabushiki Kaisha, Osaka, Japan

[21] Appl. No.: 783,081

[22] Filed: Oct. 2, 1985

[30] Foreign Application Priority Data

Oct. 17, 1984 [JP] Japan ................................ 59-216387

[51] Int. Cl.⁴ .............................................. G01D 5/34
[52] U.S. Cl. ............................ 250/231 SE; 340/347 P
[58] Field of Search .......................... 29/572, 581, 582; 235/454, 489; 250/231 SE, 237 G; 340/347 P; 356/395

[56] References Cited

U.S. PATENT DOCUMENTS 3,233,309  2/1966  Emeis ..................................... 29/581
4,286,871  9/1981  Erickson ..................... 250/237 G X

FOREIGN PATENT DOCUMENTS 0163815  10/1982  Japan ........................... 250/231 SE
0021411  2/1985  Japan ........................... 250/231 SE Primary Examiner—Eugene R. LaRoche
Assistant Examiner—Steven J. Mottola
Attorney, Agent, or Firm—Finnegan, Henderson, Farabow, Garrett, & Dunner

[57] ABSTRACT

A rotary disc for an optical rotary encoder has a diameter of 15 to 50 mm, a thickness of 20 to 200 μm and 200 to 1,500 slits. The disc is made of nickel phosphorous alloy. A warpage of the disc is not greater than 100 μm. Such a rotary disc is produced in accordance with a method comprising the steps of holding the disc between two planes and applying heat and pressure to the clamped disc. It is desirable to use plating of metal onto the disc in a pattern.

17 Claims, 10 Drawing Figures

DISC FOR ROTARY ENCODER AND METHOD FOR PRODUCING SAME

FIELD OF THE INVENTION AND RELATED ART STATEMENT

The present invention relates to a rotary disc used in optical rotary encoders and a method for producing same.

Optical rotary encoders have been used in various fields as sensors for detecting a rotational angle. A rotary disc in which formed are a number of slits is incorporated in an interior of the optical rotary encoder. In particular, discs for encoders having a high resolving power are produced through a process in which a metal is evaporated onto a glass plate and the stuck metal thereon is etched to form slits or the like. However, the manufacturing process is complicated and hence, the products are costly. On the other hand, for a less expensive encoder, a method has been carried out in which a metal plate provided with slits is used as a disc. Such a disc made of metal is produced in accordance with one of the following three methods:

1. a method in which a metal plate is mechanically punched out to form a disc;
2. a method in which a resist pattern is formed on a metal plate and thereafter, an etching process is applied thereto to form a disc (which method is further divided into the two kinds of methods where a connecting strip is provided in advance between the disc and a metal plate portion other than the disc and the wire is mechanically cut in the final step and where during the etching process, a disc is separated apart from the metal plate simultaneously with the formation of the slits); and
3. a method in which a resist pattern is formed on a thin metal plate; thereafter, an electroplating is applied to the metal plate portion on the resist layer; and after the formation of the disc, the removal of the thin metal plate is carried out to form a final disc.

However, the metal disc produced in accordance with the above-described methods is inferior in flatness due to a warp or curvature of the metal plate per se derived from a raw material, a warp produced during mechanical processes, a warp caused by an internal stress upon plating, a warp caused during dealing with the disc and the like. When such a disc is loaded on an optical rotary encoder, since the metal disc 1 is fixed to a shaft 4 by a hub 3, the warp or curvature is reduced. However, the warp cannot be completely corrected but remains as a warp or curvature (a). When such a warp is present, a distance between the slit portion of the metal disc 1 and a fixed slit plate 2 (or a optical sensor 6) is changed in accordance with a rotational angle. As a result, a strength of a signal and a contrast are unstable to cause a malfunction. It is preferable that the distance between the fixed slit plate 2 and the metal disc 1 be shorter than an arrangement pitch of the slits of the metal disc 1 and it is necessary that the warp of the metal disc be smaller than that corresponding to the distance between the optical sensor 6 and the metal disc 1. Accordingly, in a metal disc having a high density of slits, the warp must be smaller.

In order to reduce the warp (a) in case of the disc fixed to the hub, it is preferable that the warp of the metal disc per se be suppressed.

The warp (b) of the metal disc per se is defined by a distance between two planes minus the thickness of the disc in the case where the distance therebetween is at minimum when the metal disc is held between two geometrical planes which are in parallel with each other, as shown in FIG. 2.

In case of a metal disc having a diameter of 15 mm to 50 mm, a thickness of 20 $\mu$m to 200 $\mu$m and 200 to 1,500 slits for an optical rotary encoder of small size and high resolving power, it is preferable that the warp (b) of the disc per se be equal to or less than 100 $\mu$m in order to obtain a stable singal strength and a good contrast in the rotary encoder. However, according to the prior art methods, it is difficult to make the warp less than 100 $\mu$m with the metal disc for the optical rotary encoder of small size and high resolving power for the above-described reason.

OBJECT AND SUMMARY OF THE INVENTION

An object of the present invention is to provide a metal disc for an optical rotary encoder of small size and high resolving power, which is provided with an excellent flatness having a warp (b) of 100 $\mu$m or less.

The present invention relates to a metal disc for an optical rotary encoder of small size and high resolving power and more particularly to a metal disc having a diameter of 15 mm to 50 mm, a thickness of 20 $\mu$m to 200 $\mu$m and 200 to 1,500 slits. The disc is held between two planes and is heated and pressurized so that the warp (b) is suppressed to 100 $\mu$m or less. The invention also relates to a method for producing such a disc for an optical rotary encoder. The number of the slits is defined by the number of the slits included in one turn of slit rows arranged in a circumferential direction of the disc. According to the present invention, a metal disc, having a large warp, obtained in accordance with a conventional process is held between two planes and the heating and pressurizing process is conducted with such a disc. One surface, to be contacted with the metal disc, of the plane for holding the metal disc must be rigid with a high flatness whereas the other surface thereof may be formed of flexible material such as fluorine resin. Also, the flatness of the rigid surface of the plane must be equal to or more than that of the metal disc. However, the plane having the flatness that is applicable to the present invention, with a warp of for example, about 10 $\mu$m may readily be obtained. Therefore, there is no problem in obtaining such a plane.

The heating temperature is 0.3 to 0.9 times of a melting point or eutectic point of metal in terms of the absolute temperature, more preferably 0.35 to 0.7 times and most preferably 0.37 to 0.6 times. In the case where the heating temperature is lower than the lower limit of the suitable temperature range, it is often impossible to correct the warp, and inversely in the case where the heating temperature is higher than the upper limit, the minute or fine shape of the slit portions of the metal disc is deformed resulting in a degradation of the metal disc. Also, in the case of heating in the air, an unnecessary oxidation of the metal is accelerated. It is preferable that the heating duration be 1 minite to 3 hours and more preferable, in view of reliability and operability, that the heating duration be 5 minites to 1 hour.

Also, a heating method may be adapted in which a heater is mounted on the plane body to heat the disc, or otherwise a method may be applied in which the metal disc is held between the two planes to heat the disc in an oven or an electric furnace. It is necessary that the rigid material for the plane should not be molten or softened by the applied temperature. Also, in order to suppress the deformation of the plane due to the heating, it is preferable that the rigid material for the plane should have a small thermal expansion rate. In particular, it is more preferable that the coefficient of linear expansion rate is equal to or less than $10 \times 10^{-6}$ per degree C in the case where the plane is used at a temperature of 500° C. or more. For example, ceramics, porcelains, quartz or the like may be used as the rigid material for the plates. At a relatively low temperature, it is possible to use metal, sodaglass and the like.

Upon the heating, the pressurization is simultaneously carried out and it is sufficient that the pressure is in the range of 0.5 $G/cm^2$ to 100 $Kg/cm^2$. However, to avoid a deformation of the slit portions of the metal disc, it is preferable that the pressure is such that the warp of the metal disc may be corrected, for example, in the range of 1 $G/cm^2$ to 500 $G/cm^2$.

The type of metal forming the metal disc to which the present invention pertains is limited to nickel-phosphorus alloy and more preferably, nickel-phosphorus alloy in an amorphous state may be used as the metal for the disc.

With respect to the composition ratio of the nickel-phosphorus alloy, it is preferable that the phosphorus content be in the range of 3 to 15% by weight in the alloy, and it is more preferable that the content be in the range of 5 to 12% by weight. The nickel-phosphorus alloy specified in these ranges has a high hardness of about 600 Hv, and in addition, when the heating process is applied thereto, its hardness is further increased unlike an ordinary metal such as nickel whose hardness is decreased upon heating. Accordingly, the disc made of nickel-phosphorus alloy is further preferable because the warp is corrected when the disc is held between the two planes and is heated.

The heating temperature for the nickel-phosphorus alloy is in the range of 150° C. to 400° C., more preferably, 160° C. to 350° C. and most preferably 180° C. to 280° C. A temperature ranged in the range is lower than an annealing temperature of the stainless steel. In the range of the temperature, the nickel-phosphorus alloy is used as the disc material to improve the workability. Consequently, it is possible to correct the warp by heating in low cost. When the temperature is lower than the lower limit of the range, it is impossible to correct the warp whereas, when the temperature is higher than the upper limit, although the hardness is increased, a brittleness or fragility is increased to reduce a mechanical strength of the disc. Also, in the latter case, in the air, an unnecessary oxidation is induced in its surface region.

According to the method described above, it is possible to suppress the warp of the metal disc to 100 μm or less. Furthermore, in the case where a ratio of the warp to the arrangement pitch of the slits which has been processed by heat and pressure (i.e., warp per pitch) is equal to or less than 1.0, or more strictly, 0.7 or less, when such a disc is used in a rotary encoder, it is possible to obtain a more stable signal.

The present invention pertains to a metal disc having a diameter of 15 mm to 50 mm, a thickness of 20 μm to 200 μm and 200 to 1,500 slits (the number of slits). For the slits arranged in a row at a high density, it is desired that the warp be smaller. In particular, the present invention is more effectively applied to a disc having the slit density of 3 per mm or more, further, 5 per mm or more.

The metal disc to which the present invention relates may be produced in accordance with the conventional methods such as the mechanical punching, the etching and the plating. However, in the mechanical punching method, there is a limit for manufacturing fine molds. Thus, the punching method is not suitable for discs having a higher density of slits. Also, in the etching method, a so-called "side etch" problem is raised to increase deviation of width of slits, and it would be difficult to arrange the slits at a high density. In comparison with these methods, the plating method is suitable for discs having the high density of slits, in particular for discs having the slit density of 3 per mm or 5 per mm or more.

DETAILED DESCRIPTION OF THE PREFERRED EMBODIMENTS

Figure 1:
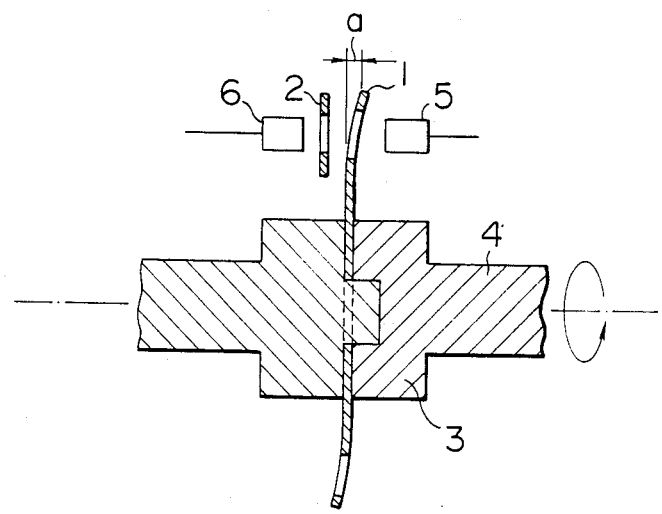
FIG. 1 is a side view of a metal disc incorporated into an optical rotary encoder.
Figure 2:
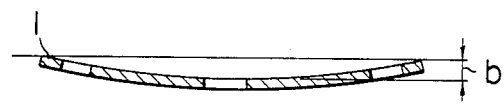
FIG. 2 is a view illustrating a definition of a warp of a disc.
Figure 3A:
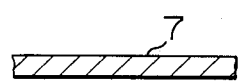
FIGS. 3A, 3B, 3C, 3D, 3E and 3E' are views illustrating an example of steps of a method for producing a disc according to the present invention.

A producing process of a metal disc according to a plating method will now be described with reference to FIG. 3. FIG. 3A is a side cross-sectional view showing a thin metal plate 7 which serves as a cathode. The thin metal plate, preferably, has an etching property different from that of metal deposited by the electroplating in the case where the thin metal plate is removed by the etching in a step D later described. In this case, the deposited metal is not etched upon the etching removal of the thin metal plate and it is possible to carry out a highly accurate etching. Material for the thin metal plate is Al, Sn, Zn or the like.

Figure 3B:
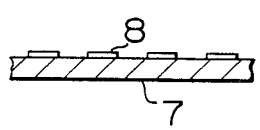

FIG. 3B shows a resist formation step and shows cross-sectional portion of slit portions 10 of the disc. Reference numeral 8 denotes resists which is finally to be the slit portions 10. As a method of forming a resist on a portion other than a pattern portion, a screen printing or a gravure printing may be used but it is preferable to use a photoresist with which a fine pattern is easy to obtain. The formation of the pattern may be attained through coating, exposure and development processes. The suitable photoresists are of the negative type such as KPR, KOR, KPL, KTFR, and KMER made by Eastman Kodak Co., F8R made by Fuji Yakuhin Kogyo Co., TPR and OMR81 made by Tokyo Ohka Co. and the like and of the positive type such as KADR made by Eastman Kodak Co., AZ-1350 of Shipley Co. and the like. Also, a dry film resist may be used but a liquid resist is superior in resolving power.

Figure 3C:
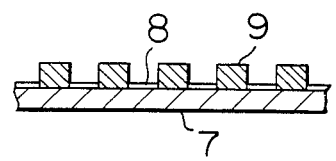

FIG. 3C shows an electroplating step in which a reference numeral 9 denotes electrically deposited metal. As a kind of deposited metal, any metal may be used if it can be deposited. However, in view of a hardness, a rigidity, an anti-corrosion property, an economical point and a heating process property, it is preferable to use a nickel and a nickel alloy. In particular, it is preferable to use a nickel-phosphorus alloy, as described before. It is preferable that a thickness of plated metal be in the range of 20 to 200 μm, more preferably, of 20 to 100 μm. Incidentally, although it is possible to carry out a chemical plating instead of the electroplating, the electrolyte plating is superior in economical point and productibility.

Figure 3D:
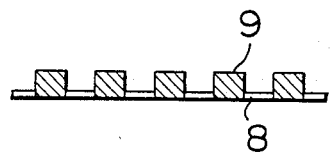

FIG. 3D shows a step of removing the thin metal plate. The removal of the metal plate may be attained by the etching or the mechanical stripping. However, to avoid a damage of the disc and to obtain a higher reliablity, it is preferable to adopt the etching removal. Upon the etching removal, it is possible to remain a part of the thin plate as a reinforcement plate on the disc side by carrying out a partial etching. As the etching liquid, it is possible to use diluted hydrochloric acid or alkaline solution such as sodium hydroxide solution in the case where the thin metal plate is made of Al, Zn, or Sn as described above. Incidentally, after the etching removal is carried out, the resist remains on the disc side as shown in FIG. 3D whereas in the case of mechanical stripping, almost all of the resist remains on the side of the thin metal plate.

Figure 3E:
Figure 3E:
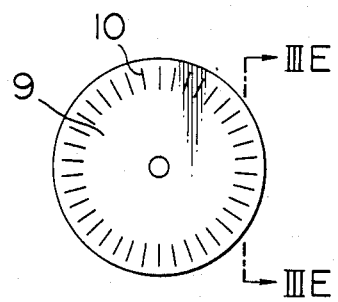

FIG. 3E is a view showing a step of stripping the resist and is a cross-sectional view taken along dotted lines IIIE—IIIE of FIG. 3E'. An usual resist release liquid which is available on the market may be used as the resist release agent. For instance, resist strips J-100 or N-500 sold by Nagase Sangyo Co. may be used. Also in the case of stripping removal of the thin metal plate in the step D, since residual portions of the resist is left, it is preferable to remove the resist by releasing. Incidentally, the steps D and E may be performed in the opposite order.

Figure 4A:
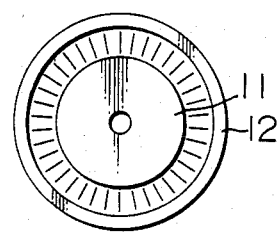
FIGS. 4A and 4B show a disc with a reinforcement plate, the part A thereof being a view from a back side and the part B thereof being a side view of the disc.
Figure 4B:
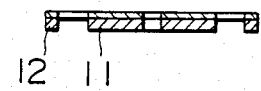

The reinforcement plate applied to the disc by the partial etching of the thin metal plate serves to enhance the mechanical strength of the disc. Instead of this method of providing the reinforcement plate, it is possible to perform a method in which a reinforcement plate such as a metal plate is applied to a one-sided surface of the metal disc as a backing layer. FIGS. 4A and 4B show a disc to which a reinforcement plate is applied as a backing layer.

To more clearly explain the present invention, specific examples will be described. However, it is apparent that the present invention is not limited to such specific examples but the present invention is applicable similarly to a movable slit plate for a linear gauge or a method of producing a fixed slit plate for an encoder, and many modifications and variants are possible within the spirit of the invention.

EXAMPLE 1

A negative type resist "microresist-747-110cSt" made by Eastman Kodak Co. was applied onto an aluminum thin plate of 80 μm so that the applied layer was at 3 μm and was prebaked. The resist was exposed through a disc pattern for an encoder by a high pressure mercury lamp and was developed with a specific developer or a rinse liquid. The processed resist was post-baked to form a resist pattern on a portion other than the disc pattern on one side surface of the aluminum thin plate.

Subsequently, a nickel-phosphorus alloy having a thickness of 35 μm and containing about 8% by weight phosphorus was formed on the surface pattern portion by electroplating with a nickel-phosphorus electroplating liquid "Nikkerin B" sold by Okuno Chemical Industries Co. while using the aluminum thin plate as an cathode. The aluminum thin plate was etched and removed by hydrochloric acid of 18% by weight. Thereafter, the resist was released apart by using the resist strip "N-500" sold by Nagase Sangyo Co. The obtained nickel-phosphorus alloy had an outer diameter of 24 mm, a thickness of 35 μm and 400 slits. 100 discs were produced in the same method and warps b were measured to be in a range of 150 μm to 2 mm. Subsequently, these discs were, in order, held by glass plates which were available on the marcket while applying thereto a pressure of 38 G/cm² and heating the discs at a temperature of 230° C. for 45 minites. Thereafter, the discs were cooled at room temperature. As a result, the warps of the discs were reduced to 3 to 20 μm and the ratio (warp per pitch) was in the range of 0.02 to 0.12. Thus 100 discs made of metal for an optical rotary encoder and having an excellent flatness were obtained.

EXAMPLE 3

In the same manner as in the example 1, the electroplating was conducted. The resist was removed with resist strip "N-500" sold by Nagase Sangyo Co. Thereafter, a thin aluminum plate is etched to be removed with sodium hydroxide of 5% by weight. Thus, the disc had a thickness of 35 μm, an outer diameter of 24 mm and 400 slits. By repeating the process, 100 discs were obtained. The warps of the discs were in the range of 150 μm to 2 mm. Subsequently, the heating and pressurizing process as in the Example 1 was conducted to the discs. The warps of the discs were in the range of 3 to 20 μm. The ratio (warp/ pitch) was in the range of 0.02 to 0.12. Thus, the 100 metal discs for an optical rotary encoder with a high flatness were obtained.

As described above, the metal disc according to the present invention is made of metal, which is less costly and the warp thereof is equal to or less than 100 μm with an excellent flatness may be obtained. Therefore, when the disc is applied to an optical rotary encoder of small size and high resolving power, it is possible to obtain a signal having a sufficiently stable strength and a high contrast. Thus, it is possible to realize a rotary encoder having high accuracy and high reliablity in low cost.

We claim:

1. A rotary disc for an optical rotary encoder, wherein said rotary disc is made of nickel-phosphorous alloy, the diameter of said rotary disc being in a range of 15 mm to 50 mm, the thickness of said rotary disc being in a range of 20 μm to 200 μm, said rotary disc having between 200 to 1,500 slits therein, wherein warp of said rotary disc is not greater than 100 μm.

2. A rotary disc as set forth in claim 1, wherein a ratio of the warp to a pitch of the slits (warp per pitch) is not greater than 1.0.

3. A rotary disc as set forth in claim 1, wherein a density of the slits is not less than three per mm.

4. A rotary disc as set forth in claim 3, wherein a content of phosphorus is in a range of 3 to 15% by weight.

5. A rotary disc as set forth in claim 1, wherein a reinforcement plate is applied to said rotary disc as a backing layer.

6. A method of producing, for a rotary encoder, a disc made of nickel-phosphorous alloy having a maximum warpage no greater than approximately 100 micro meters, comprising:

forming a disc having a diameter between 15 mm to 50 mm, a thickness of approximately 20 to 200 micro meters and approximately 200 to 1500 slits therewithin on a thin metal plate having an upper surface portion;

placing said formed disc between two opposing plane surfaces, one of said plane surfaces having a warpage no greater than 100 micro meters;

pressing said formed disc to a respective selected pressure between said plane surfaces;

heating said pressed disc to a selected temperature for a selected time to reduce the warpage of said disc to no greater than 100 micro meters; and releasing said disc from between said plane surfaces.

7. The method as in claim 6, wherein the step of forming comprises the substeps of:

applying a resist on said upper surface portion of said thin metal plate;

forming a pattern portion on said resist;

developing said pattern portion on said resist;

electroplating said thin metal plate with nickel-phosphorous alloy to form on said upper surface portion a layer of said alloy having a configuration substantially similar to said developed pattern portion;

removing said thin metal plate from said electroplated alloy layer to form said disc; and releasing said resist from said plated metal layer disc.

8. The method as in claim 7, wherein said disc has an etching property different from the etching property of said thin metal plate.

9. The method as in claim 7 wherein said nickel-phosphorous alloy has a phosphorous content in a range of 3 to 15 percent by weight.

10. The method as in claim 7, wherein the step of removing said thin metal plate includes the substep of etching said metal plate.

11. The method as in claim 7, wherein the step of removing said thin metal plate includes the substep of mechanically stripping said metal plate from said electroplated layer.

12. The method as in claim 7, wherein the step of releasing said resist from said plated alloy layer disc is carried out prior to the step of removing said thin metal plate from said electroplated alloy layer to form said disc.

13. The method as in claim 7, wherein the substep of removing said thin metal plate further includes the substeps of partially etching said thin metal plate to retain a reinforcing plate on said disc, said reinforcing plate having a first annular portion at the periphery of said disc and a second annular portion at a predetermined distance radially inward of said first annular portion.

14. The method as in claim 6, wherein said alloy comprising said disc has a eutectic point, and said selected temperature is between 30 and 90 percent of said eutectic point.

15. The method in claim 6, wherein said selected pressure is between 0.5 g/cm$^2$ and 100 kg/cm$^2$.

16. The method as in claim 6, wherein the ratio of the warp of said disc to the pitch of said slits is less than or equal to 1.0 after applying said heat and pressure thereto.

17. The method as in claim 6, wherein the density of slits in said disc is greater than or equal to three slits per millimeter.

* * * * *